(12) United States Patent
Xiao et al.

(10) Patent No.: US 12,426,234 B2
(45) Date of Patent: Sep. 23, 2025

(54) SEMICONDUCTOR STRUCTURE FOR DRAM HAVING A PILLAR LOWER ELECTRODE AND FORMATION METHOD THEREOF

(71) Applicant: CHANGXIN MEMORY TECHNOLOGIES, INC., Hefei (CN)

(72) Inventors: Deyuan Xiao, Hefei (CN); Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 404 days.

(21) Appl. No.: 17/901,853

(22) Filed: Sep. 2, 2022

(65) Prior Publication Data

US 2023/0422466 A1    Dec. 28, 2023

Related U.S. Application Data

(63) Continuation of application No. PCT/CN2022/107927, filed on Jul. 26, 2022.

(30) Foreign Application Priority Data

Jun. 23, 2022  (CN) .......................... 202210719325.X

(51) Int. Cl.
  *H10B 12/00*  (2023.01)
(52) U.S. Cl.
  CPC ....... *H10B 12/0387* (2023.02); *H10B 12/053* (2023.02); *H10B 12/34* (2023.02); *H10B 12/482* (2023.02); *H10B 12/488* (2023.02)
(58) Field of Classification Search
  CPC .......................... H10B 12/033; H10B 12/036; H10B 12/0387; H10B 12/053; H10B 12/34; H10B 12/488

(Continued)

(56) References Cited

U.S. PATENT DOCUMENTS

2012/0286227 A1   11/2012  Chung
2022/0093610 A1*   3/2022  Kim .................. H01L 23/53228

(Continued)

FOREIGN PATENT DOCUMENTS

CN    105097555 A    11/2015
CN    114551450 A     5/2022

OTHER PUBLICATIONS

ISA State Intellectual Property Office of the People's Republic of China, International Search Report Issued in Application No. PCT/CN2022/107927, Dec. 22, 2022, WIPO, 9 pages.

*Primary Examiner* — Hoai V Pham
(74) *Attorney, Agent, or Firm* — Kilpatrick Townsend & Stockton LLP

(57) ABSTRACT

Embodiments relate to a semiconductor structure and a formation method thereof. The method for forming a semiconductor structure includes: forming a substrate and a semiconductor layer positioned above the substrate, where the semiconductor layer includes first trenches spaced along a first direction, the first direction being a direction parallel to a top surface of the substrate; forming, in the semiconductor layer, an isolation trench positioned below the first trenches, where the isolation trench extends along the first direction and continuously communicates with the first trenches; forming a first spacer at least positioned in the isolation trench; and forming a capacitor above the first spacer. The semiconductor structure and the formation method thereof reduce electric leakage between the substrate and the capacitor, thereby improving electrical performance of the semiconductor structure.

19 Claims, 13 Drawing Sheets

(58) Field of Classification Search
USPC .................................................. 257/906, 908
See application file for complete search history.

(56) References Cited

U.S. PATENT DOCUMENTS

2022/0173109 A1  6/2022  Rigano
2022/0189957 A1  6/2022  Atanasov et al.

* cited by examiner a ⟷ a' b ⟷ b' c ⟷ c' d ⟷ d'

SEMICONDUCTOR STRUCTURE FOR DRAM HAVING A PILLAR LOWER ELECTRODE AND FORMATION METHOD THEREOF

CROSS-REFERENCE TO RELATED APPLICATION

This application is a continuation of PCT/CN2022/107927, filed on Jul. 26, 2022, which claims priority to Chinese Patent Application No. 202210719325.X, titled "SEMICONDUCTOR STRUCTURE AND FORMATION METHOD THEREOF" and filed on Jun. 23, 2022, the entire contents of which are incorporated herein by reference.

TECHNICAL FIELD

The present disclosure relates to the field of semiconductor fabrication technology, and more particularly, to a semiconductor structure and a formation method thereof.

BACKGROUND

As a semiconductor apparatus commonly used in electronic devices such as computers, Dynamic Random Access Memory (DRAM) comprises a plurality of memory cells, and each of the memory cells typically includes a transistor and a capacitor. The transistor has a gate electrically connected to a word line, a source electrically connected to a bit line, and a drain electrically connected to the capacitor. A word line voltage of the word line may control turn-on and turn-off of the transistor, such that data information stored in the capacitor can be read or written into the capacitor by means of the bit line.

A conventional semiconductor structure such as the DRAM is prone to electric leakage between the capacitor and a substrate due to limitations of its structure, which reduces performance of the semiconductor structure.

SUMMARY

A semiconductor structure and a formation method thereof provided by some embodiments of the present disclosure are configured to reduce electric leakage between a capacitor and a substrate, to improve electrical performance of the semiconductor structure.

According to some embodiments, the present disclosure provides a method for forming a semiconductor structure, including following steps of: forming a substrate and a semiconductor layer positioned above the substrate, where the semiconductor layer includes a plurality of first trenches spaced along a first direction; forming, in the semiconductor layer, an isolation trench positioned below the first trenches, where the isolation trench extends along the first direction and continuously communicates with the plurality of first trenches; forming a first spacer at least positioned in the isolation trench; and forming a capacitor above the first spacer.

According to other embodiments, the present disclosure also provides a semiconductor structure, which includes: a substrate; a semiconductor layer positioned above the substrate; a first spacer positioned above the semiconductor layer; and a capacitor structure positioned above the spacer and comprising a plurality of capacitors.

DETAILED DESCRIPTION

The embodiments of the semiconductor structure and the formation method thereof provided by the present disclosure will be described in detail below with reference to the accompanying drawings.

Figure 1:
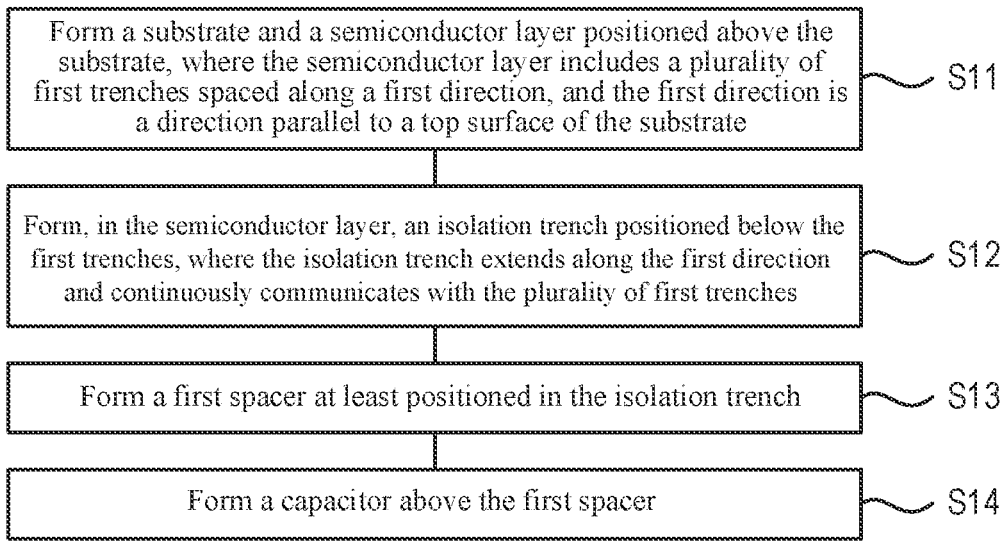
FIG. 1 is a flowchart of a method for forming a semiconductor structure according to an embodiment of the present disclosure.
Figure 2:
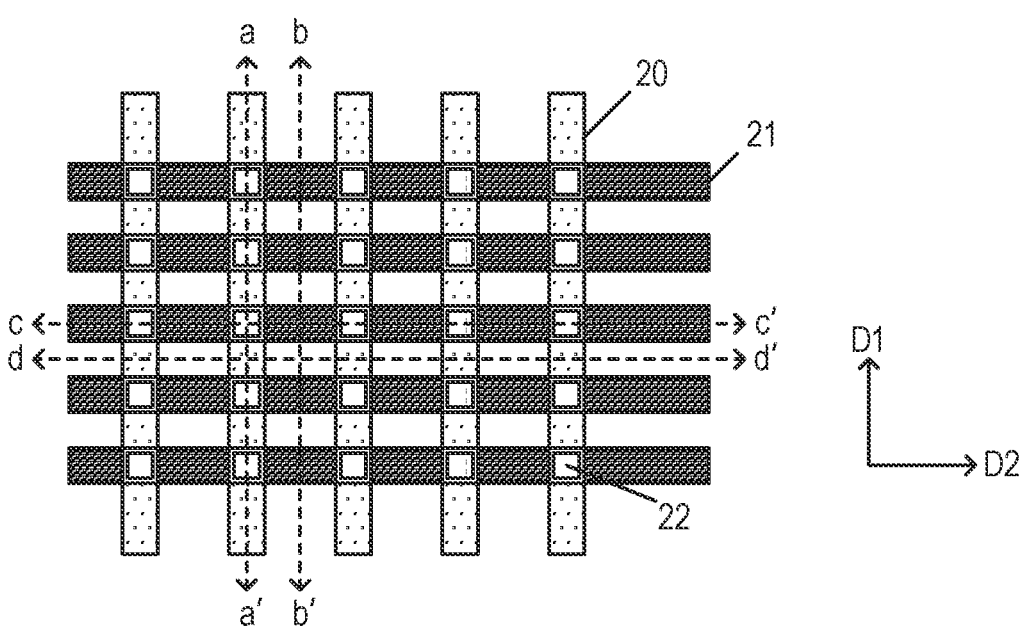
FIGS. 2 to 13 are schematic structural diagrams showing main processes in a process of forming the semiconductor structure according to some embodiments of the present disclosure.

This embodiment provides a method for forming a semiconductor structure. FIG. 1 is a flowchart of the method for forming a semiconductor structure according to an embodiment of the present disclosure, and FIGS. 2 to 13 are schematic structural diagrams showing main processes in a process of forming the semiconductor structure according to some embodiments of the present disclosure. FIG. 2 is a schematic structural vertical view of the semiconductor structure formed in this embodiment. FIGS. 3 to 13 are schematic cross-sectional views showing processes for four positions a-a', b-b', c-c', and d-d' in FIG. 2 during formation of the semiconductor structure, such that the process of forming the semiconductor structure is clearly indicated. The semiconductor structure in this embodiment may be, but is not limited to, a dynamic random access memory (DRAM). As shown in FIGS. 1 to 13, the method for forming a semiconductor structure includes following steps.

Figure 6:
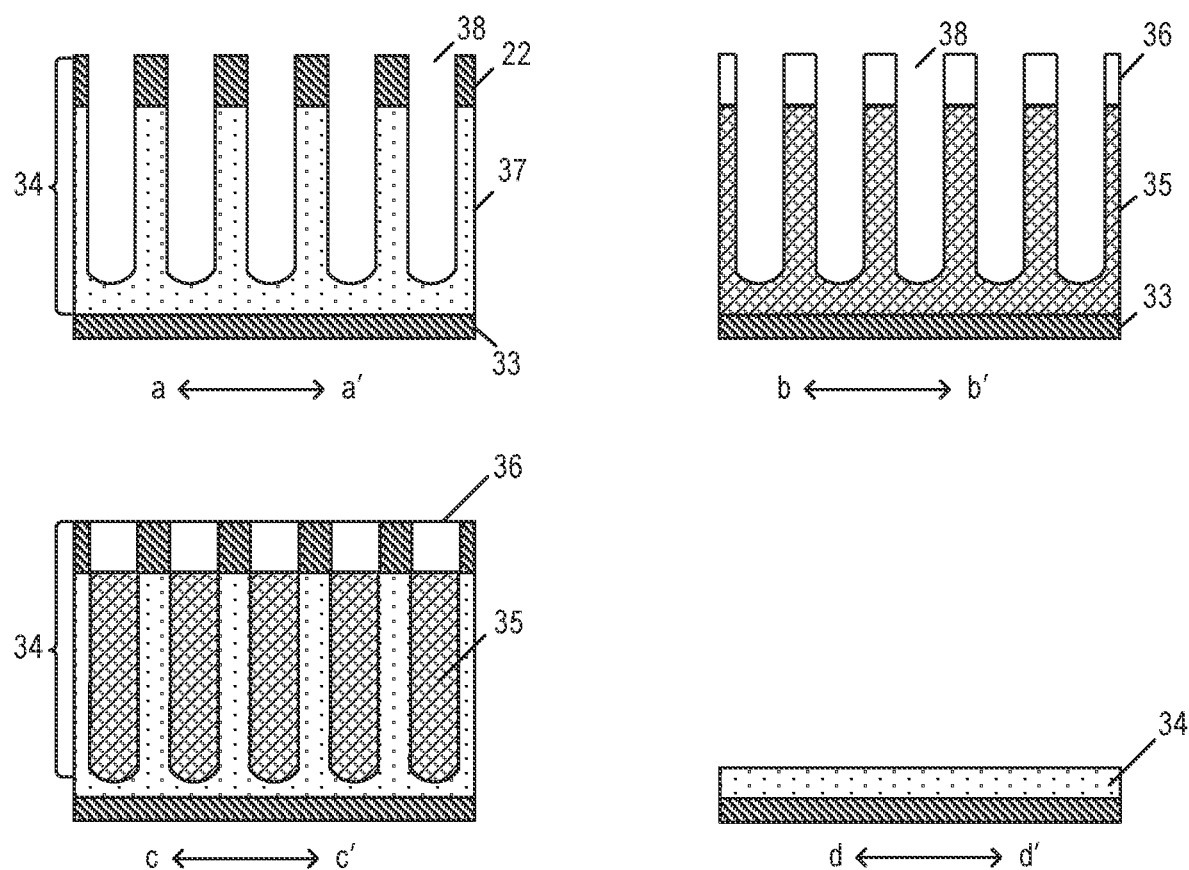

Step S11, forming a substrate 33 and a semiconductor layer 34 positioned above the substrate 33, where the semiconductor layer 34 includes a plurality of first trenches 38 spaced along a first direction D1, as shown in FIG. 2 and FIG. 6.

This embodiment is described by taking an example where the first direction D1 is a direction parallel to a top surface of the substrate 33. In some embodiments, the substrate 33 may be, but is not limited to, a silicon substrate. This embodiment is described by taking an example where the substrate 20 is a silicon substrate. In other embodiments, the substrate 33 may be a semiconductor substrate such as gallium nitride, gallium arsenide, gallium carbide, silicon carbide, or silicon on insulator (SOI). The substrate 33 is configured to support device structures thereon. The top surface of the substrate 33 refers to a surface of the substrate 33 facing toward the semiconductor layer 34.

Figure 3:
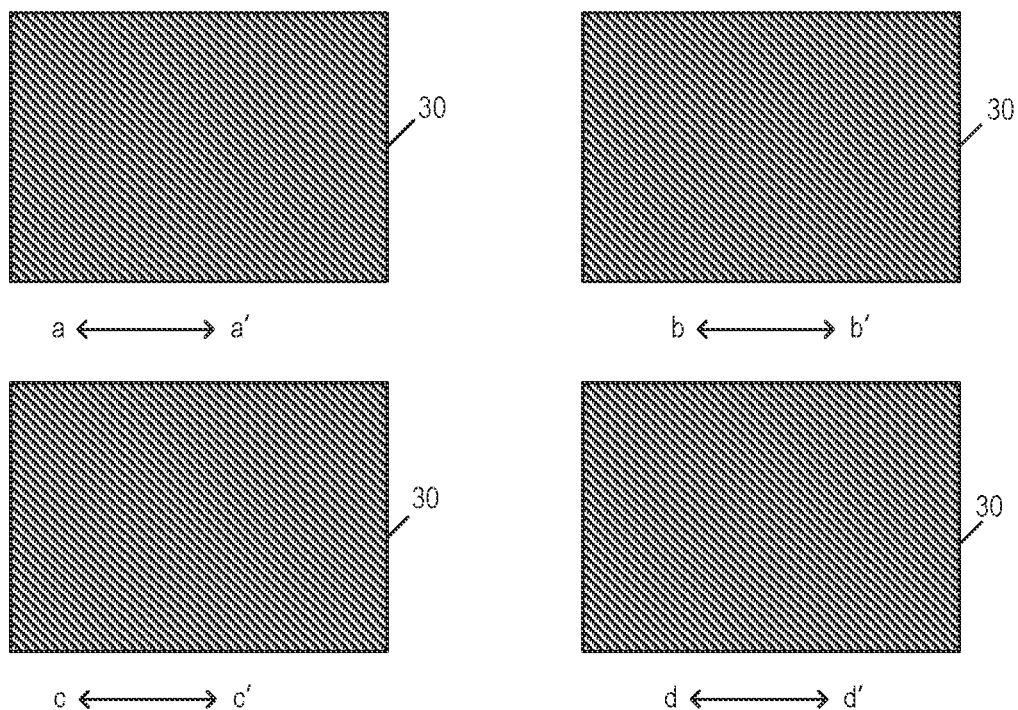
Figure 4:
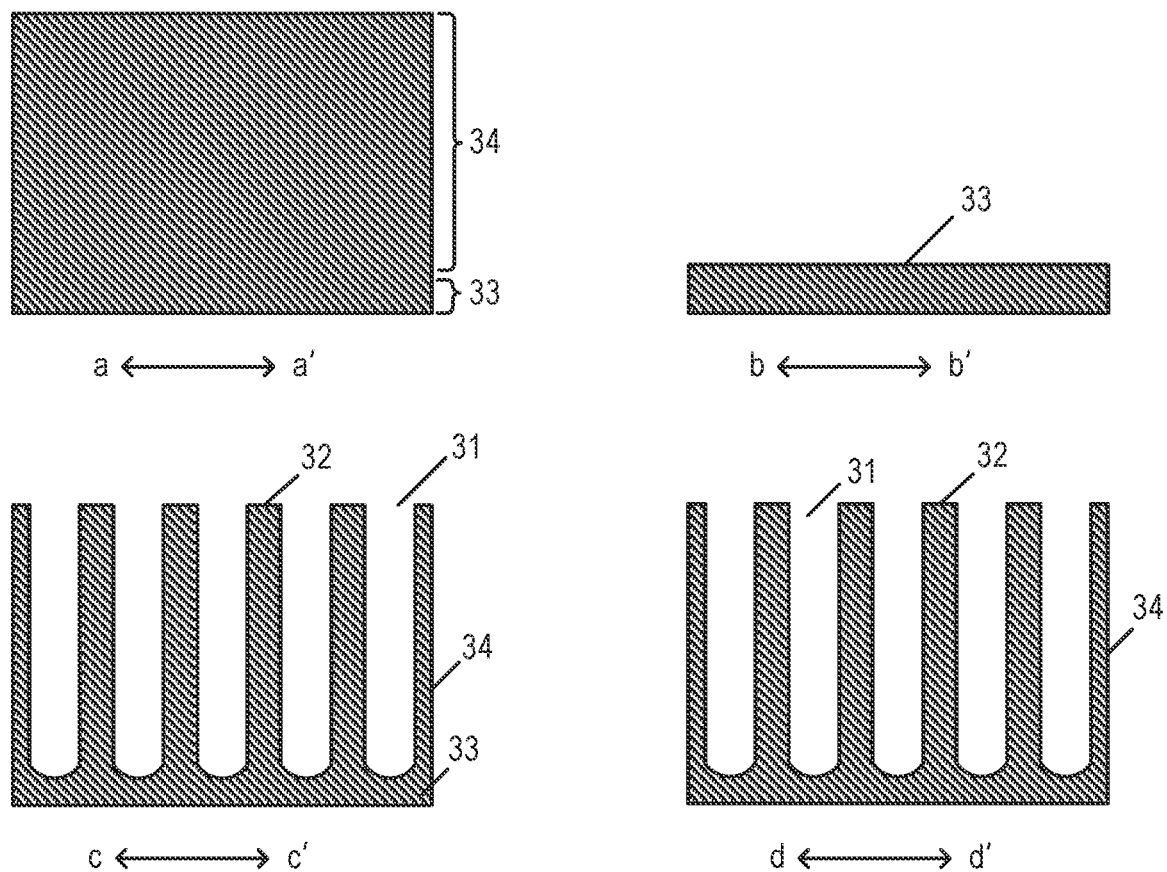

In some embodiments, the step of forming a substrate 33 and a semiconductor layer 34 positioned above the substrate 33 includes: providing an initial substrate 30, as shown in FIG. 3; etching the initial substrate 30 along the first direction D1 to form the semiconductor layer 34 and the substrate 33 positioned below the semiconductor layer 34, where the semiconductor layer 34 includes a plurality of second trenches 31 spaced along a second direction D2, and the first direction D1 intersects the second direction D2, as shown in FIG. 2 and FIG. 4; and etching the semiconductor layer 34 to form the plurality of first trenches 38 spaced along the first direction D1.

Figure 5:
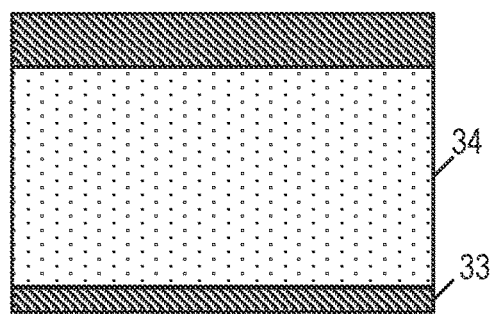
Figure 5:
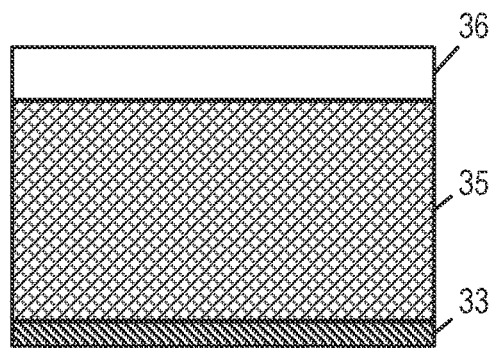
Figure 5:
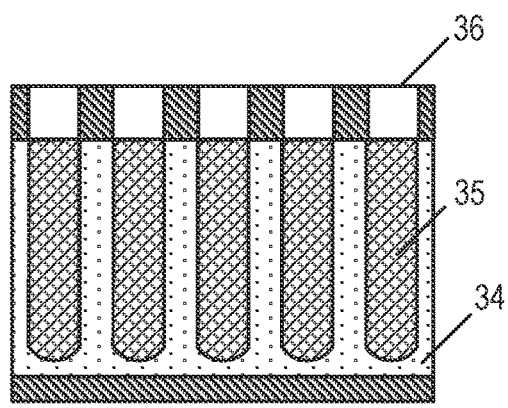
Figure 5:
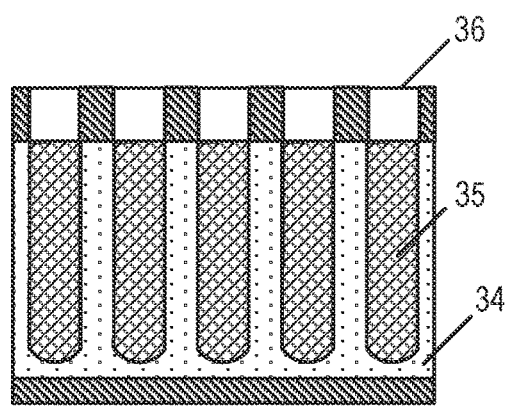

In some embodiments, before forming the plurality of first trenches 38 spaced along the first direction D1, the method further includes: defining a capacitor region and an active area in the semiconductor layer 34; forming a support layer 36 wrapping the active area of the semiconductor layer 34, as shown in FIG. 5, where the support layer 36 is provided with a support opening exposing a given one of the plurality of second trenches 31 in the capacitor region; and depositing a first dielectric material into the given second trench 31 in the capacitor region along the support opening, and forming a sacrificial layer 35 filling up the given second trench 31 in the capacitor region, as shown in FIG. 5.

In some embodiments, the step of forming a sacrificial layer 35 filling up the given second trench 31 in the capacitor region includes: depositing a first dielectric material comprising a doping element into the given second trench 31 in the capacitor region along the support opening, and implanting the doping element into the semiconductor layer 34 while forming the sacrificial layer 35 filling up the given second trench 31 in the capacitor region.

This embodiment is described by taking an example where the second direction D2 is a direction parallel to the top surface of the substrate 33, and the first direction D1 is orthogonal to the second direction D2. In some embodiments, a material of the initial substrate 30 may be, but not limited to, silicon. The initial substrate 30 may be etched along the first direction D1 by means of a photolithographic process, the plurality of second trenches 31 spaced along the second direction D2 are formed in the initial substrate 30, and the semiconductor layer 34 including the plurality of second trenches 31 is formed. A remaining part of the initial substrate 30 below the semiconductor layer 34 forms the substrate 33. Each of the second trenches 31 extends along the first direction D1, and the second trench 31 does not penetrate through the semiconductor layer 34 along a direction perpendicular to the top surface of the substrate 33. The capacitor region and the active area are defined in the semiconductor layer 34, where the active area is positioned above the capacitor region along the direction perpendicular to the top surface of the substrate 33. The capacitor region of the semiconductor layer 34 is subsequently configured to form a capacitor, and the active area of the semiconductor layer 34 is subsequently configured to form a transistor.

Next, the support layer 36 wrapping the active area in the semiconductor layer 34 is formed. The step of forming the support layer 36 may include: depositing an insulating dielectric material such as oxide (e.g., silicon dioxide) into the second trench 31, to form a filling layer filling up the second trench 31. The filling layer is back-etched, such that the semiconductor layer 34 in the active area is exposed, while the semiconductor layer 34 in the capacitor region is still wrapped by the filling layer. Next, a material such as nitride (e.g., silicon nitride) is deposited on a surface of the filling layer to form the support layer 36 wrapping the semiconductor layer 34 in the active area. The support layer 36 is patterned (e.g., multi-step photolithography is performed on the support layer 36), a support opening exposing the filling layer is formed in the support layer 36, and a remaining part of the support layer 36 wraps the semiconductor layer 34 in the active area. Next, all the filling layer is removed along the support opening by means of a wet etching process or a dry etching process to expose the semiconductor layer 34 in the capacitor region.

After the support layer 36 is formed and the semiconductor layer 34 in the capacitor region is exposed, the first dielectric material including a doping element may be deposited into the second trench 31 in the capacitor region along the support opening by means of a plasma vapor deposition process, such that the doping element is implanted into the semiconductor layer 34 in the capacitor region while the sacrificial layer 35 filling up the second trench 31 in the capacitor region is formed. Because the semiconductor layer 34 in the active area is wrapped by the support layer 36, the doping element is not implanted into the semiconductor layer 34 in the active area. The semiconductor layer 34 implanted with the doping element serves as a first semiconductor layer 341, and the semiconductor layer 34 positioned in the active area and not implanted with the doping element serves as a second semiconductor layer 342, as shown in FIG. 5. According to this embodiment, doping of the semiconductor layer 34 in the capacitor region is completed while the second trench 31 in the capacitor region is filled. In one aspect, the semiconductor layer 34 may be supported by the sacrificial layer 35, and conductivity of the semiconductor layer 34 in the capacitor region is enhanced. In another aspect, the doping is completed during the filling, and two processes (i.e., a filling process and a doping process) are integrated, such that a process of fabricating the semiconductor structure can be simplified, and fabrication costs of the semiconductor structure can be reduced.

In some embodiments, the first dielectric material is phosphosilicate glass. This is because phosphorus in the phosphosilicate glass can perform N-type doping on the semiconductor layer 34 in the capacitor region, thereby enhancing the conductivity of the semiconductor layer 34 in the capacitor region. Moreover, an etching rate of the phosphosilicate glass is equal or similar to an etching rate of silicon doped with phosphorus (a material of the semiconductor layer 34 in the capacitor region after doping is silicon doped with phosphorus). Therefore, when the phosphosilicate glass and the semiconductor layer are subsequently etched to form the first trench 38, it can be ensured that a side wall of the formed first trench 38 is smooth, such that the first trench 38 has a better shape. The phosphosilicate glass is only an example, and those skilled in the art may also select a type of the first dielectric material according to actual needs.

In some embodiments, the step of forming a plurality of first trenches 38 spaced along the first direction D1 includes: etching the semiconductor layer 34 along the second direction D2 to form the plurality of first trenches 38 spaced along the first direction D1, where a depth of the first trench 38 is smaller than that of the second trench 31.

In some embodiments, the semiconductor layer 34, the support layer 36 and a part of the sacrificial layer 35 may be etched along the second direction D2 by means of the photolithographic process to form the plurality of first trenches 38 spaced along the first direction D1. Each of the first trenches 38 extends along the second direction D2, and the first trench 38 does not penetrate through the first semiconductor layer 341 along the direction perpendicular to the top surface of the substrate 33. The first semiconductor layer 341 between adjacent two of the first trenches 38 forms a conductive pillar 37, and the second semiconductor layer 342 between adjacent two of the first trenches 38 forms an active pillar 22, as shown in FIG. 6. A depth of the first trench 38 is smaller than that of the second trench 31 along the direction perpendicular to the top surface of the substrate 33, such that a space configured to form a first spacer is reserved between the first trench 38 and the substrate 33.

In some embodiments, the doping element is implanted into two opposite side surfaces of the conductive pillar 37 along the second direction D2.

Figure 17:
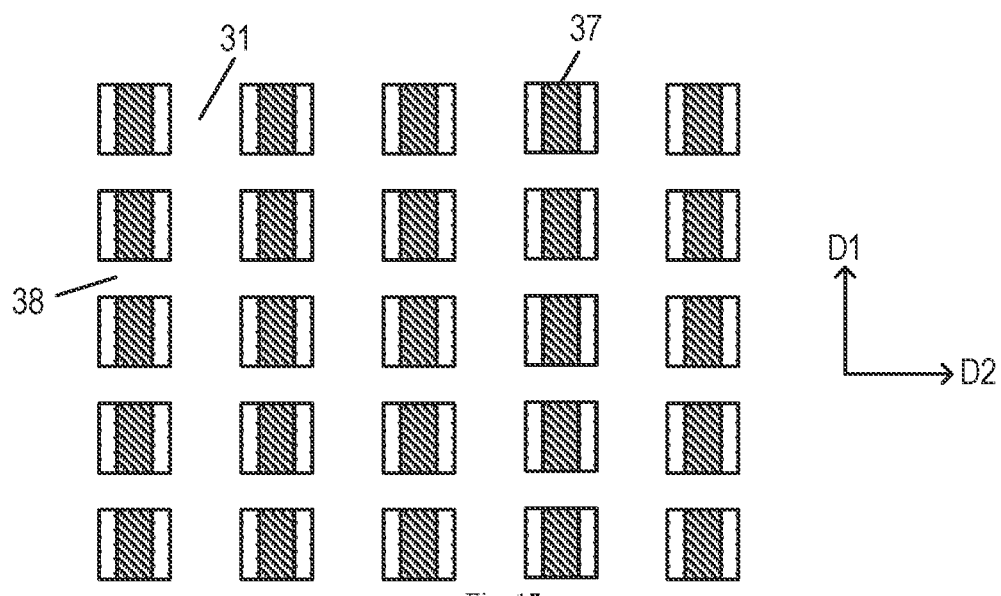
FIG. 17 is a schematic structural vertical view of a plurality of conductive pillars according to an embodiment of the present disclosure.

FIG. 17 is a schematic structural vertical view of a plurality of conductive pillars according to an embodiment of the present disclosure. As shown in FIG. 17, the first trench 38 extends along the second direction D2, the plurality of first grooves 38 are spaced along the first direction D1; the second trench 31 extends along the first direction D1, and the plurality of second trenches 31 are spaced along the second direction D2. The doping element is implanted into two opposite side surfaces of the conductive pillar 37 along the second direction D2, while two opposite side surfaces of the conductive pillar 37 along the first direction D1 are not implanted with the doping element, such that there is a difference in etching rate between the two opposite side surfaces of the conductive pillar 37 along the second direction D2 and the two opposite side surfaces of the conductive pillar 37 along the first direction D1, to facilitate selective etching of different side surfaces of the conductive pillar 37.

Figure 7:
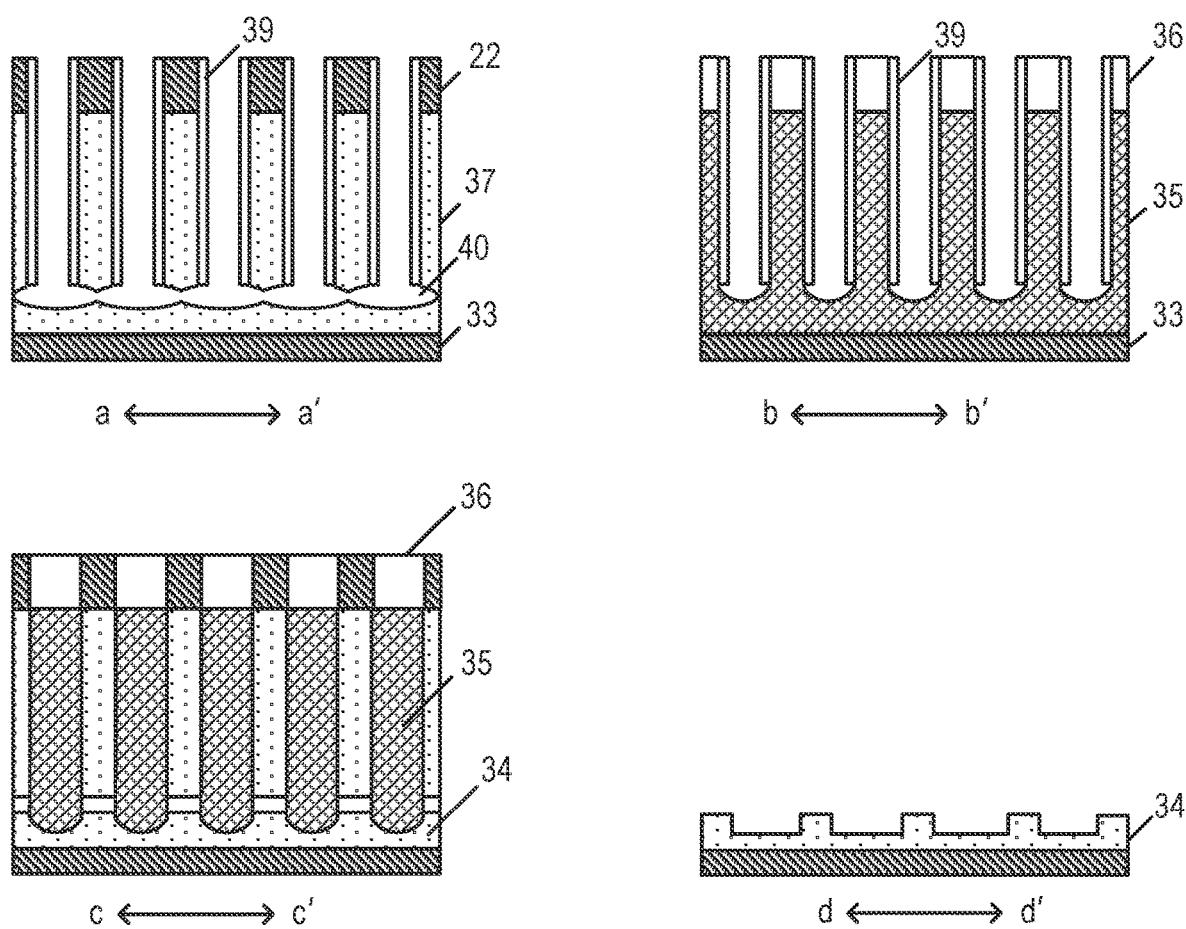

Step S12, forming, in the semiconductor layer 34, an isolation trench 40 positioned below the first trench 38, where the isolation trench 40 extends along the first direction D1 and continuously communicates with the plurality of first trenches 38, as shown in FIG. 7 and FIG. 2.

In some embodiments, the step of forming, in the semiconductor layer 34, an isolation trench 40 positioned below the first trench 38 includes: forming a protective layer 39 covering a side wall of the first trench 38; and etching the semiconductor layer 34 below the first trench 38 along the first trench 38 to form the isolation trench 40 extending along the first direction D1 and continuously communicating with the plurality of first trenches 38.

To reduce the fabrication costs of the semiconductor structure, in one embodiment, the step of forming a protective layer 39 covering a side wall of the first trench 38 includes: depositing a protective material on an inner wall of the first trench 38, to form the protective layer 39; etching back to remove the protective layer 39 at a bottom of the first trench 38 to expose the semiconductor layer 34 at the bottom of the first trench 38. To simplify the process of fabricating the semiconductor structure, in another embodiment, the step of forming a protective layer 39 covering a side wall of the first trench 38 includes: depositing a protective material on the side wall of the first trench 38 by means of a reverse top selective (RTS) deposition process, to directly form the protective layer 39 only covering the side wall of the first trench 38. A material of the protective layer 39 and a material of the first semiconductor layer 341 should have a higher etching selectivity. For example, the etching selectivity of the protective layer 39 to the first semiconductor layer 341 is greater than 3. In an embodiment, the material of the protective layer 39 is a nitride material (e.g., silicon nitride).

After the protective layer 39 only covering the side wall of the first trench 38 is formed, the first semiconductor layer 341 positioned below the first trench 38 may continue to be etched along the first trench 38 by means of a Bosch etching process to form the isolation trench 40 extending along the first direction D1 and continuously communicating with the plurality of first trenches 38. The isolation trench 40 disconnects bottoms of the plurality of conductive pillars 37 and continuously communicates with the plurality of first trenches 38. In the process of forming the isolation trench 40 by means of etching, the side wall of the first trench 38 is covered with the protective layer 39, such that damage to a side wall of the conductive pillar 37 by an etchant can be avoided, thereby further ensuring stability of the electrical performance of the semiconductor structure.

Figure 8:
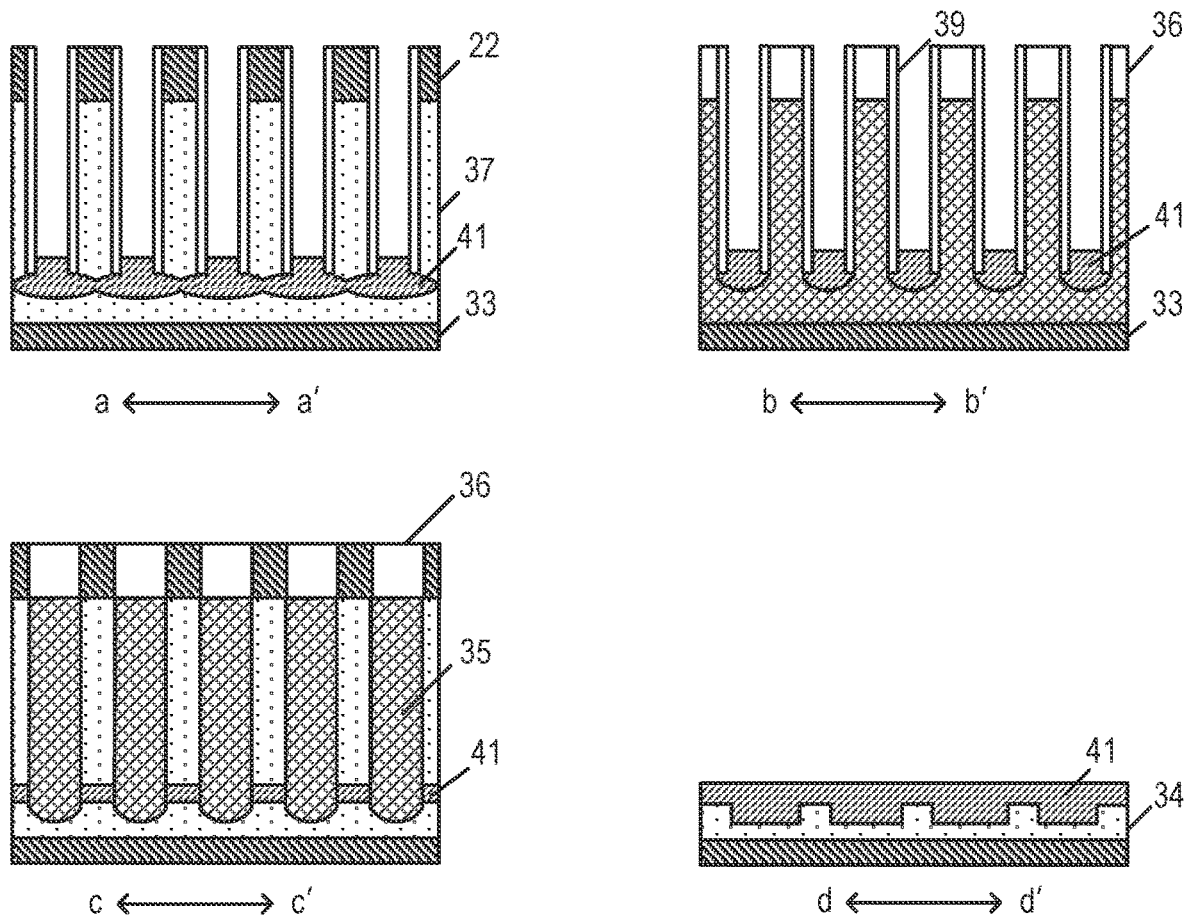

Step S13, forming a first spacer 41 at least positioned in the isolation trench 40, as shown in FIG. 8.

In some embodiments, the step of forming a first spacer 41 at least positioned in the isolation trench 40 includes: depositing a second dielectric material along the first trench 38 to form the first spacer 41 at least filling up the isolation trench 40.

In some embodiments, the second dielectric material may be deposited into the first trench 38 and the isolation trench 40 by means of a chemical vapor deposition process, a physical vapor deposition process or an atomic layer deposition process, to form the first spacer 41. Next, the entire first spacer 41 in the first trench 38 or a part of the first spacer 41 in the first trench 38 is etched back, such that a remaining part of the first spacer 41 at least fills the isolation trench 40. The second dielectric material may be, but is not limited to, an oxide material (such as silicon dioxide). The first spacer 41 is configured to electrically isolate the substrate 33 from a capacitor formed subsequently, thereby reducing or even avoiding the electric leakage between the capacitor and the substrate 33.

In some embodiments, a top surface of the first spacer 41 is flush with a bottom surface of the first trench 38; or the top surface of the first spacer 41 is positioned above the bottom surface of the first trench 38.

In some embodiments, in an example, the top surface of the first spacer 42 is flush with the bottom surface of the first trench 38, such that the first spacer 42 does not cover a surface of the protective layer 39 to reserve a larger space for subsequent formation of the capacitor, thereby further improving capacitance of the capacitor. In another example, the top surface of the first spacer 41 is positioned above the bottom surface of the first trench 38, such that the first spacer 41 covers a part of the protective layer 39 to increase a thickness of the first spacer 41, thereby better isolating the substrate 33 from the capacitor.

Figure 10:
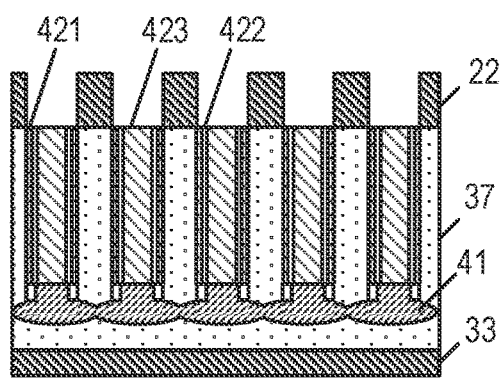
Figure 10:
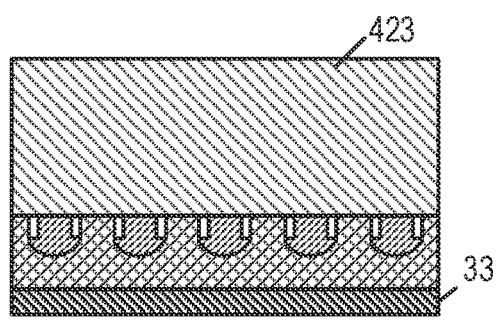
Figure 10:
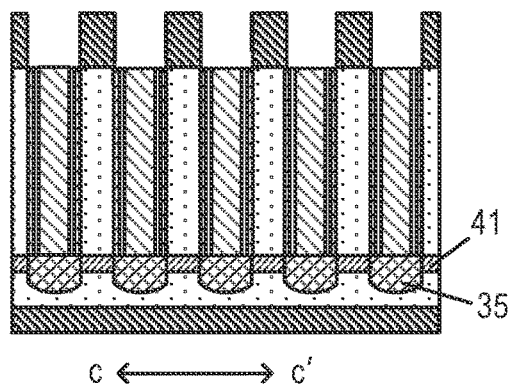
Figure 10:
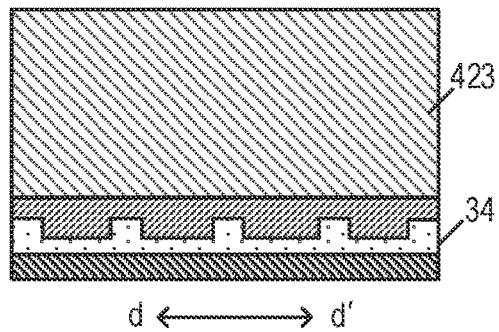

Step S14, forming a capacitor above the first spacer 41, as shown in FIG. 10.

Figure 9:
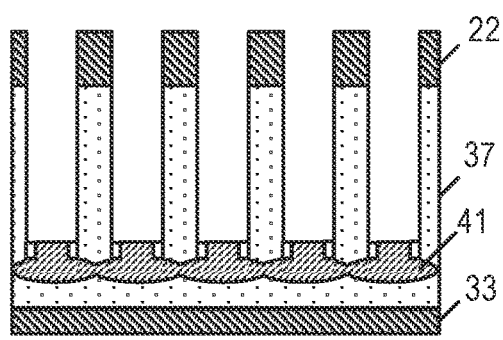
Figure 9:
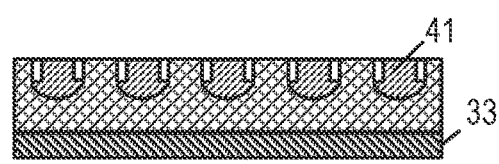
Figure 9:
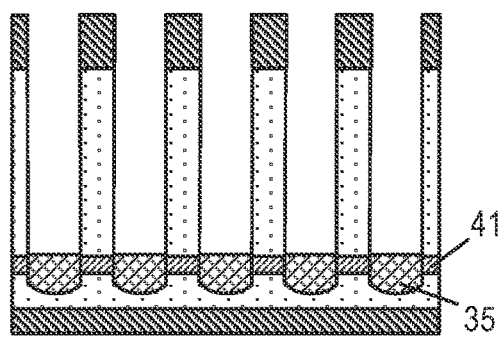
Figure 9:
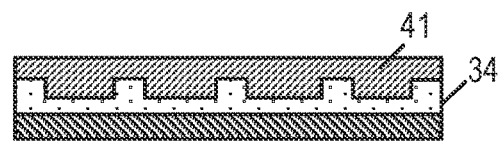

In some embodiments, the step of forming a capacitor above the first spacer 41 includes: removing all of the protective layer 39 positioned above the first spacer 41, part or all of the sacrificial layer 35 positioned above the first spacer 41 and all of the support layer 36 positioned above the first spacer 41, to form etch holes comprising the first trench 38 and the second trench 31 communicating with each other and a semiconductor pillar positioned between adjacent two of the etch holes, where the semiconductor pillar includes a conductive pillar 37 positioned in the capacitor region and an active pillar 22 positioned in the active area, as shown in FIG. 9; forming a conductive layer 421 covering a side wall of the conductive pillar; forming a dielectric layer 422 covering a surface of the conductive layer 421; and forming an upper electrode layer 423 covering a surface of the dielectric layer 422, as shown in FIG. 10.

In some embodiments, after all of the protective layer 39, part or all of the sacrificial layer 35 and all of the support layer 36 positioned above the first spacer 41 are removed, the first trench 38 communicates with the second trench 31 to form the etch holes positioned in the semiconductor layer 34. The etch holes positioned in the capacitor region serves as capacitor holes. Next, a conductive material such as tungsten or titanium nitride (TiN) may be deposited on a side wall of the etch hole by means of a selective atomic layer deposition process to form a conductive layer 421. Next, a dielectric layer 422 covering a surface of the conductive layer 421 and an upper electrode layer 423 covering a surface of the dielectric layer 422 are formed. A material of the upper electrode layer 423 may be same as that of the conductive layer 421. The capacitor includes the conductive pillar 37, the conductive layer 421, the dielectric layer 422 and the upper electrode layer 423, where the conductive pillar 37 and the conductive layer 421 jointly serve as a lower electrode layer of the capacitor.

The dielectric layer 422 may be made of a strontium titanate (STO) material with a high dielectric constant (HK), and the conductive layer 421 and the upper electrode layer 423 are formed by ruthenium or ruthenium oxide and so on, such that a height of the capacitor along the direction perpendicular to the top surface of the substrate 33 may be reduced, and an etching depth of etching the capacitor hole configured to form the capacitor is reduced, thereby further reducing difficulty of the process. In other examples, the dielectric layer 422 may also be formed by any one or more of aluminum oxide, zirconium oxide, and hafnium oxide, and correspondingly, the conductive layer 421 and the upper electrode layer 423 are formed by TiN, etc., to reduce the fabrication costs of the semiconductor structure.

In some embodiments, after forming a capacitor above the first spacer 41, the method further includes: defining, in the active pillar 22, a channel region and a drain region and a source region distributed on two opposite sides of the channel region along a third direction, where the drain region is in contact with the conductive pillar 37, and the third direction is a direction perpendicular to the top surface of the substrate 33; and forming a plurality of word lines 21 spaced along the first direction D1, where each of the plurality of word lines 21 extends along the second direction D2 and continuously wraps the plurality of channel regions spaced along the second direction D2.

Figure 11:
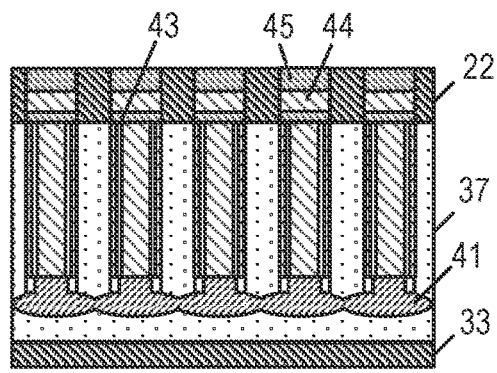
Figure 11:
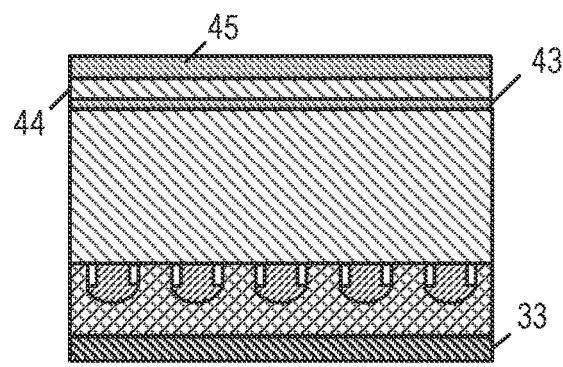
Figure 11:
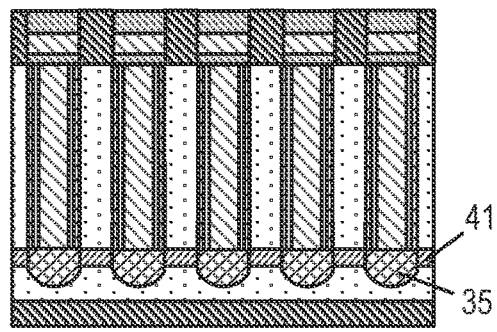
Figure 11:
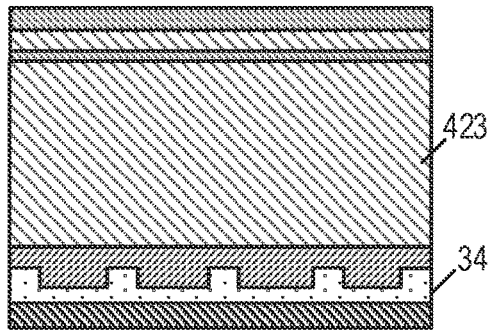
Figure 12:
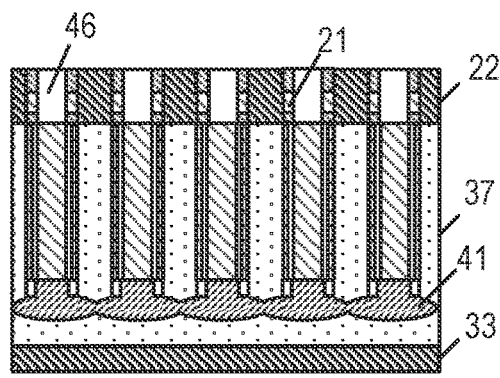
Figure 12:
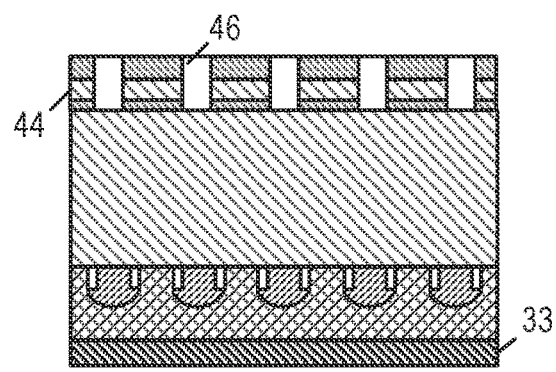
Figure 12:
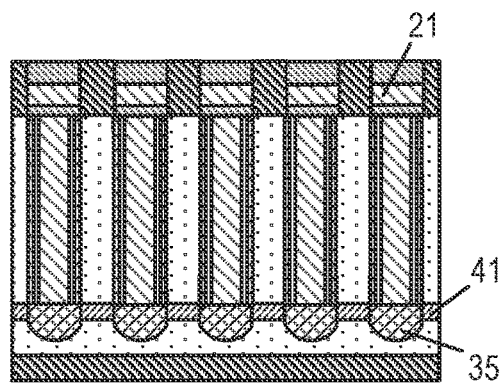
Figure 12:
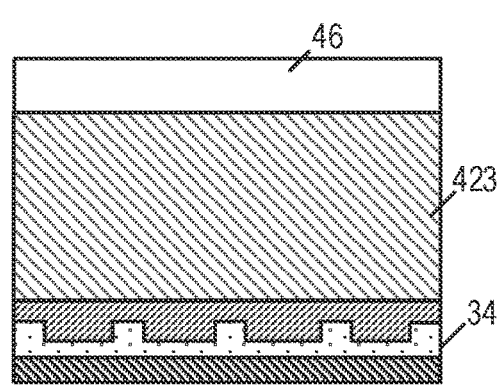

In some embodiments, after the capacitor is formed, the channel region, and the source region and the drain region distributed on two opposite sides of the channel region along the third direction are defined in the active pillar. Next, by means of a chemical vapor deposition process, a physical vapor deposition process or an atomic layer deposition process, a third spacer 43 is formed on a top surface of the capacitor, a word line material layer 44 is formed on a surface of the third spacer 43, and a fourth spacer 45 is formed on a surface of the word line material layer 44, to obtain a structure as shown in FIG. 11. The third spacer 43 covers a side wall of the drain region in the active pillar, the word line material layer 44 covers a side wall of the channel region in the active pillar, and the fourth spacer 45 covers a side wall of the source region in the active pillar. In an example, a material of the third spacer 43 and a material of the fourth spacer 45 may be an oxide material (e.g., silicon dioxide), and a material of the word line material layer 44 may be a conductive material such as TiN or tungsten. Next, the fourth spacer 45, the word line material layer 44 and the third spacer 43 are etched by means of the photolithographic process to form a word line trench exposing the capacitor. An insulating dielectric material such as an oxide (e.g., silicon dioxide) is filled in the word line trench to form a word line spacer 46, where the word line spacer 46 penetrates through the third spacer 43 and the fourth spacer 45 along the direction perpendicular to the top surface of the substrate 33, as shown in FIG. 12. The word line spacer 46 divides the word line material layer 44 into the plurality of word lines 21 spaced along the first direction D1, where each of the word lines 21 extends along the second direction D2 and continuously wraps the plurality of channel regions spaced along the second direction D2, as shown in FIG. 12. The word line 21 formed in this embodiment is of a horizontal word line structure, to further improve an integration level of the semiconductor structure.

Figure 13:
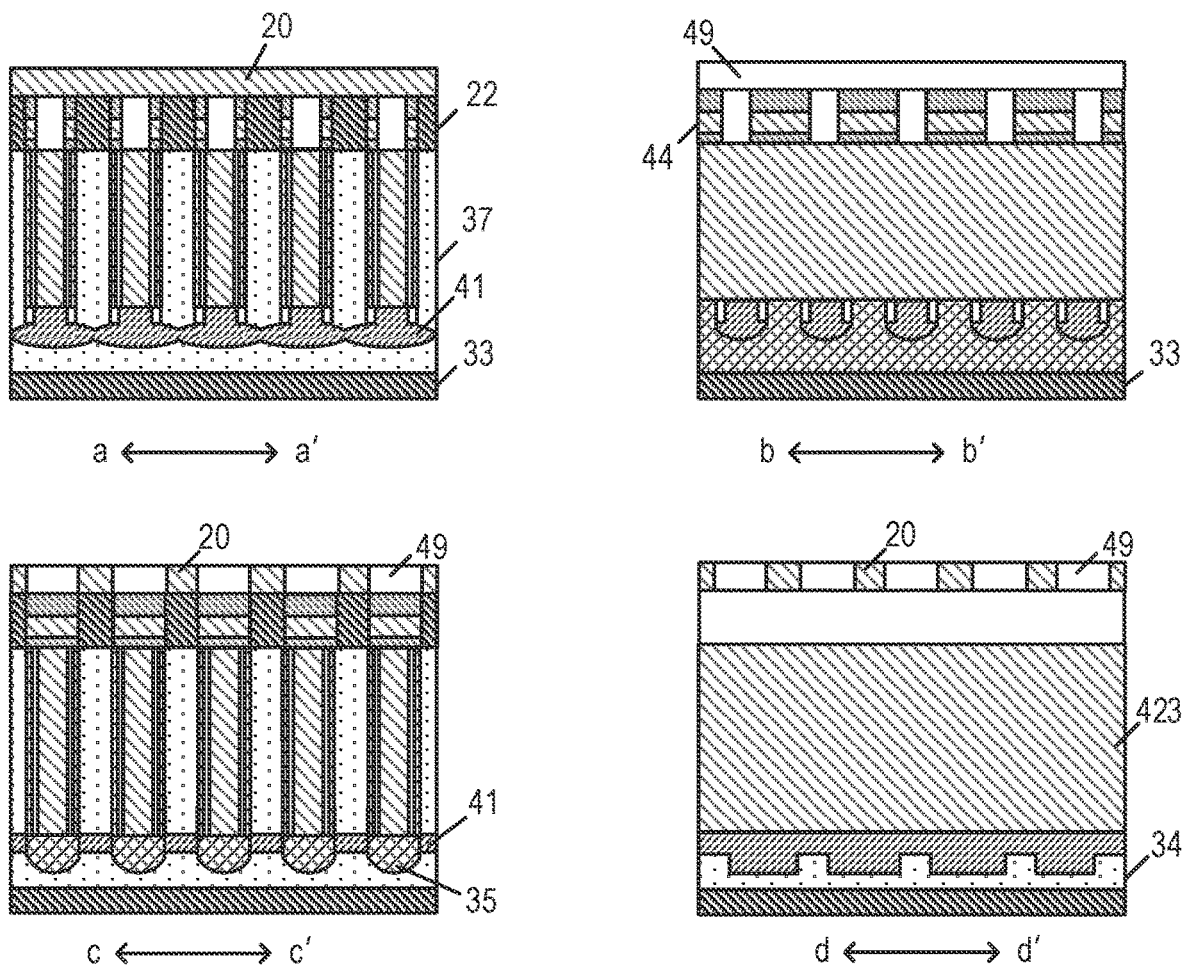

In some embodiments, after forming a plurality of word lines 21 spaced along the first direction D1, the method further includes: forming a plurality of bit lines 20 spaced along the second direction D2 above the semiconductor layer 34, where each of the plurality of bit lines 20 extends along the first direction D1 and is continuously electrically connected to the plurality of source regions spaced along the first direction D1, as shown in FIG. 13. According to this embodiment, the bit line 20 is formed at an upper part of the transistor, such that a variety of conductive materials may be flexibly selected to form the bit line 20. For example, the material of the bit line 20 may be, but is not limited to, a metal material such as tungsten, such that an internal resistance of the semiconductor structure can be reduced, and a process of fabricating the bit line is simplified.

Figure 14:
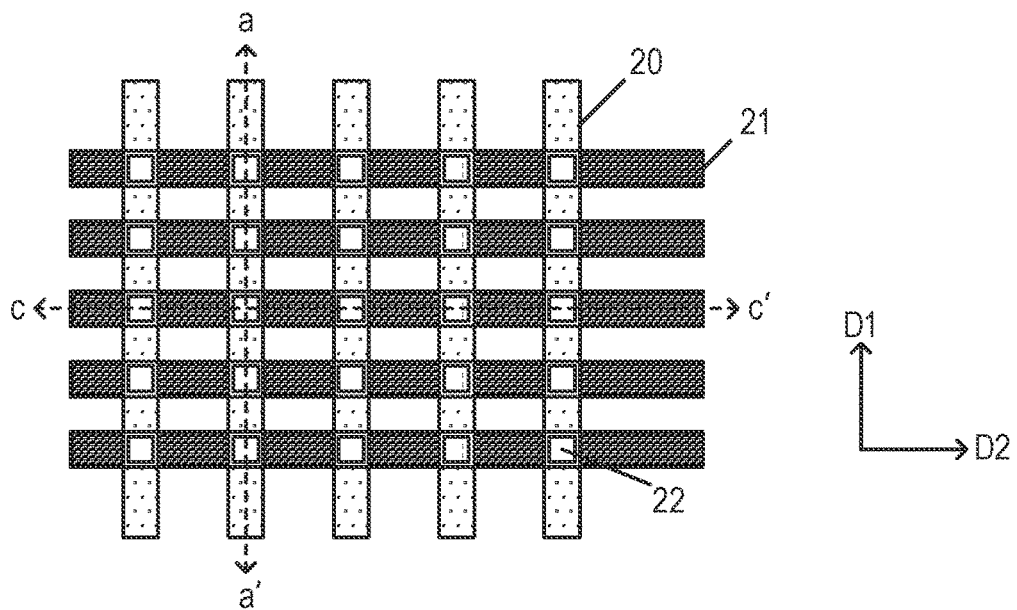
FIGS. 14 to 16 are schematic diagrams of the semiconductor structure according to some embodiments of the present disclosure.
Figure 15:
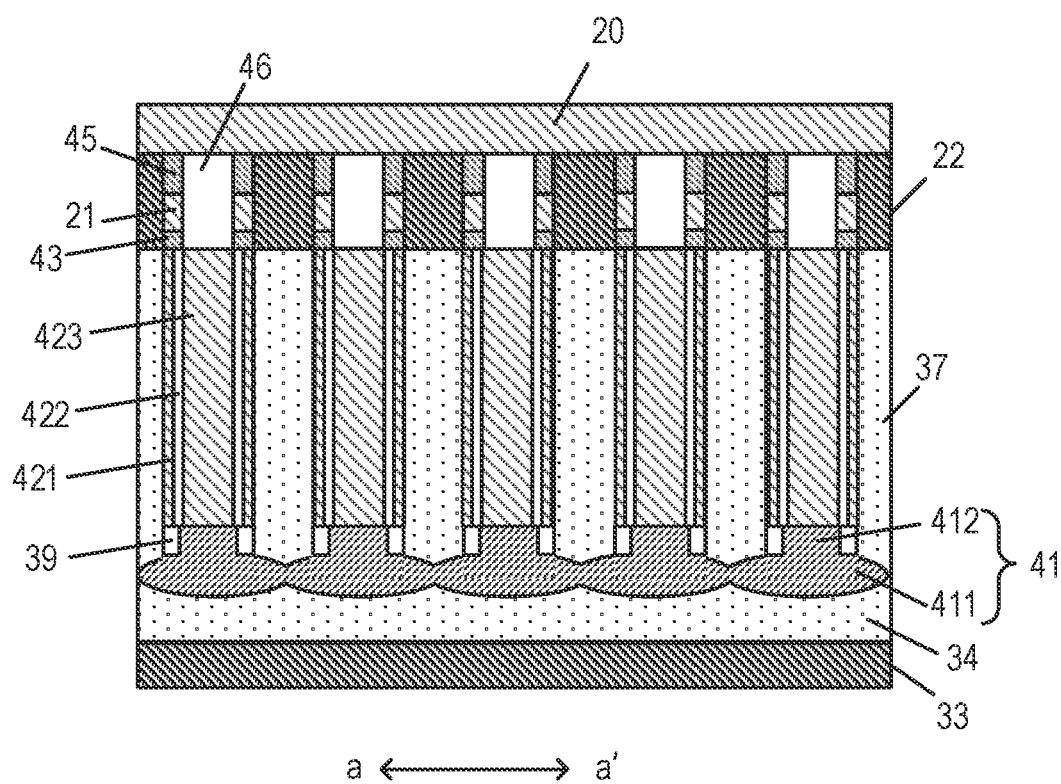
Figure 16:
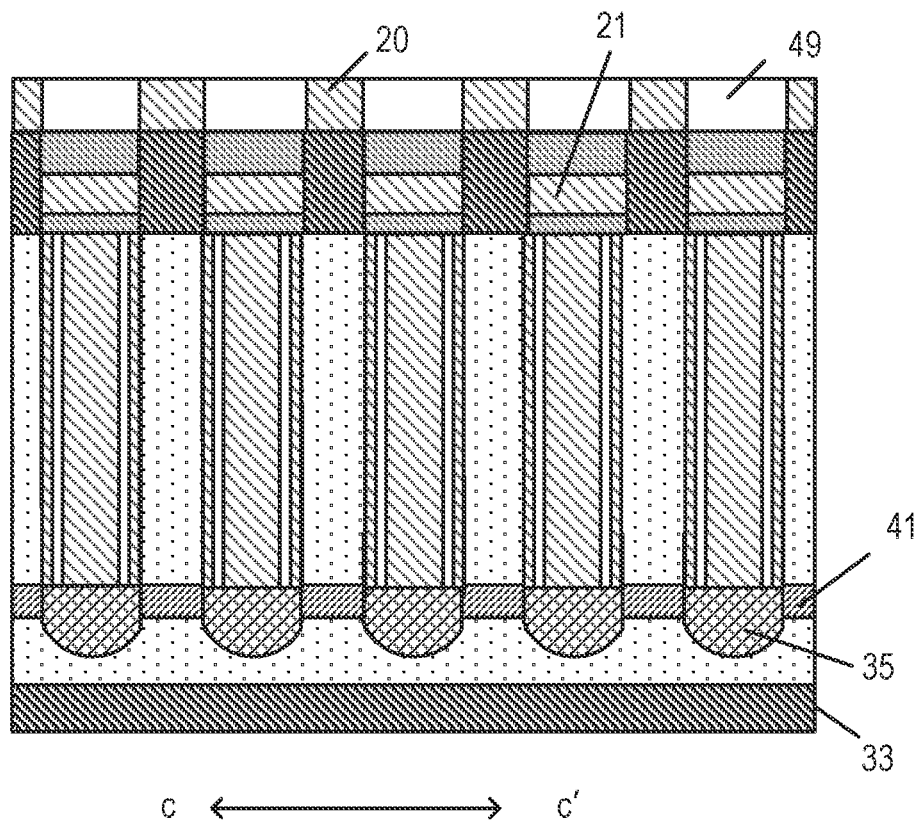

This embodiment also provides a semiconductor structure, and FIGS. 14 to 16 are schematic diagrams of the semiconductor structure according to this embodiment of the present disclosure. FIG. 14 is a schematic structural vertical view of the semiconductor structure in this embodiment, FIG. 15 is a schematic cross-sectional view at position a-a' in FIG. 14, and FIG. 16 is a schematic cross-sectional view at position c-c' in FIG. 14. The semiconductor structure provided in this embodiment may be formed by means of the method for forming a semiconductor structure as shown in FIGS. 1 to 13. As shown in FIGS. 14 to 16, the semiconductor structure includes: a substrate 33; a semiconductor layer 34 positioned above the substrate 33; a first spacer 41 positioned above the semiconductor layer 34; and a capacitor structure positioned above the first spacer 41 and including a plurality of capacitors.

In some embodiments, the substrate 33 may be, but is not limited to, a silicon substrate. This embodiment is described by taking an example where the substrate 20 is a silicon substrate. In other embodiments, the substrate 33 may be a semiconductor substrate such as gallium nitride, gallium arsenide, gallium carbide, silicon carbide, or silicon on insulator (SOI). The substrate 33 is configured to support device structures thereon. In this embodiment, by disposing the first spacer 41 of the insulating dielectric material type between the substrate 33 and the capacitor, the substrate 33 may be electrically isolated from the capacitor, to reduce the electric leakage between the substrate 33 and the capacitor.

In some embodiments, the capacitor includes: a lower electrode layer comprising a conductive pillar 37 and a conductive layer 421 covering a side wall of the conductive pillar 37, where a material of the conductive pillar 37 is the same as that of the semiconductor layer 34; a dielectric layer 422 covering a surface of the conductive layer 421; and an upper electrode layer 423 covering a surface of the dielectric layer 422.

In some embodiments, a material of the conductive pillar 37 may be a silicon material including a doping element. In an example, the doping element may be phosphorus. In another example, the material of the conductive pillar 37 may be same as that of the semiconductor layer 34, thereby reducing the difficulty of fabricating the semiconductor structure, and simplifying the process of fabricating the semiconductor structure. A material of the conductive layer 421 may be the same as that of the upper electrode layer 423, for example, a conductive material such as TiN or tungsten. The dielectric layer 422 may be made of a strontium titanate (STO) material with a high dielectric constant (HK), and the conductive layer 421 and the upper electrode layer 423 are formed by ruthenium or ruthenium oxide and so on, such that a height of the capacitor along the direction perpendicular to the top surface of the substrate 33 may be reduced, and an etching depth of etching the capacitor hole configured to form the capacitor is reduced, thereby further reducing difficulty of the process. In other examples, the dielectric layer 422 may also be formed by any one or more of aluminum oxide, zirconium oxide, and hafnium oxide, and correspondingly, the conductive layer 421 and the upper electrode layer 423 are formed by TiN, etc., to reduce the fabrication costs of the semiconductor structure.

In some embodiments, the first spacer 34 includes: a first sub spacer 411 positioned above the semiconductor layer 34; and a plurality of second sub spacers 412 protruded from a top surface of the first sub spacer 411, and the conductive pillar 37 extends between adjacent two of the second sub spacers 412.

In some embodiments, the second sub spacer 412 is protruded from the top surface of the first sub spacer 411, which not only can further increase a thickness of the first spacer 41, but also can further enhance an effect of electrical isolation between the substrate 33 and the capacitor. Furthermore, the adjacent capacitors can be better isolated to reduce electric leakage between the adjacent capacitors. The first sub spacer 411 and the second sub spacer 412 may be formed simultaneously, thereby simplifying the process of fabricating the semiconductor structure. In an example, a material of the first sub spacer 411 and a material of the second sub spacer 412 are both oxide materials (e.g., silicon dioxide). A top surface of the first sub spacer 411 refers to a surface of the first sub spacer 411 facing away from the substrate 33.

In some embodiments, the semiconductor structure further includes: a protective layer 39 positioned between the second sub spacer 412 and the conductive pillar 37.

The material of the second sub spacer 412 is different from that of the protective layer 39, which not only can reduce a parasitic capacitance effect between the adjacent conductive pillars 37, but also can simplify the process of fabricating the semiconductor structure. In an embodiment, the material of the protective layer 39 is a nitride material (e.g., silicon nitride), and the material of the second sub spacer 412 is an oxide material (e.g., silicon dioxide).

To simplify the process of fabricating the semiconductor structure and ensure the shape of the capacitor, in some embodiments, the semiconductor structure further includes: a plurality of sacrificial layers 35 positioned between the substrate 33 and the capacitor structure, where the plurality of sacrificial layers 35 are spaced along the second direction D2, and each of the plurality of sacrificial layers 35 extends along the first direction D1, and the first direction D1 intersects the second direction D2. In an example, both the first direction D1 and the second direction D2 are directions parallel to the top surface of the substrate 33, and the first direction D1 is orthogonal to the second direction D2. In this embodiment, the top surface of the substrate 33 refers to a surface of the substrate 33 facing toward the first spacer 41.

In some embodiments, a bottom surface of each of the plurality of sacrificial layers 35 is positioned below a bottom surface of the first spacer 41, and the plurality of sacrificial layers 35 are embedded in the semiconductor layer 34, such that the sacrificial layer 35 is not only configured to isolate the substrate 33 from the capacitor, but also can stably support the capacitor.

In some other embodiments, a top surface of the sacrificial layer 35 is flush with that of the first spacer 41.

In some embodiments, a material of the sacrificial layer 35 is a first dielectric material including a doping element, and a material of the conductive pillar 37 is a silicon material including the doping element.

In some embodiments, the semiconductor structure further includes: a transistor structure positioned above the capacitor structure, where the transistor structure includes transistors and word lines 21 electrically connected to the transistors, and the transistors are electrically connected to the capacitors; and a bit line structure positioned above the transistor structure, where the bit line structure includes bit lines 20 electrically connected to the transistors.

In some embodiments, the transistor includes an active pillar 22 positioned above the capacitor, and the active pillar includes a channel region, and a source region and a drain region distributed on two opposite sides of the channel region along a direction perpendicular to the top surface of the substrate 33, where the drain region is in contact with and is electrically connected to the capacitor. The plurality of word lines 21 are spaced along the first direction D1, where each of the plurality of word lines 21 extends along the second direction D2 and continuously wraps the plurality of channel regions spaced along the second direction D2. The bit line 20 is positioned above the transistor structure, and the plurality of bit lines in the bit line structure are spaced along the second direction D2. Each of the bit lines 20 extends along the first direction D1 and is continuously electrically connected to the plurality of source regions spaced along the first direction D1.

According to the semiconductor structure and the formation method thereof provided by some embodiments of the present disclosure, a first spacer is formed between a capacitor and a substrate to electrically isolate the capacitor from the substrate to reduce electric leakage between the substrate and the capacitor, thereby improving electrical performance of the semiconductor structure. Moreover, in the present disclosure, a process of forming the first spacer is compatible with a process of forming the capacitor, such that the process of fabricating the semiconductor structure is simplified, and thus the fabrication costs of the semiconductor structure are reduced.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for forming a semiconductor structure for a DRAM, comprising:
   forming a substrate and a semiconductor layer positioned above the substrate, wherein the semiconductor layer comprises a plurality of first trenches spaced along a first direction;
   forming, in the semiconductor layer, an isolation trench positioned below a given one of the plurality of first trenches, wherein the isolation trench extends along the first direction and continuously communicates with the plurality of first trenches;
   forming a first spacer at least positioned in the isolation trench; and
   forming a capacitor above the first spacer;
   wherein the capacitor comprises:
   a lower electrode layer comprising a conductive pillar and a conductive layer covering a side wall of the conductive pillar, wherein a material of the conductive pillar is the same as a material of the semiconductor layer;
   a dielectric layer covering a surface of the conductive layer; and
   an upper electrode layer covering a surface of the dielectric layer.

2. The method according to claim 1, wherein the forming a substrate and a semiconductor layer positioned above the substrate comprises:
  providing an initial substrate;
  etching the initial substrate along the first direction to form the semiconductor layer and the substrate positioned below the semiconductor layer, wherein the semiconductor layer comprises a plurality of second trenches spaced along a second direction, the first direction intersecting with the second direction; and
  etching the semiconductor layer to form the plurality of first trenches spaced along the first direction.

3. The method according to claim 2, wherein before forming the plurality of first trenches spaced along the first direction, the method further comprises:
  defining a capacitor region and an active area in the semiconductor layer;
  forming a support layer wrapping the active area of the semiconductor layer, wherein the support layer is provided with a support opening exposing a given one of the plurality of second trenches in the capacitor region; and
  depositing a first dielectric material into the given second trench in the capacitor region along the support opening, and forming a sacrificial layer filling up the given second trench in the capacitor region.

4. The method according to claim 3, wherein the forming a sacrificial layer filling up the given second trench in the capacitor region comprises:
  depositing a first dielectric material comprising a doping element into the given second trench in the capacitor region along the support opening, and implanting the doping element into the semiconductor layer while forming the sacrificial layer filling up the given second trench in the capacitor region.

5. The method according to claim 4, wherein the first dielectric material is phosphosilicate glass.

6. The method according to claim 4, wherein the forming, in the semiconductor layer, an isolation trench positioned below a given one of the plurality of first trench comprises:
  forming a protective layer covering a side wall of the given first trench; and
  etching the semiconductor layer below the given first trench along the given first trench to form the isolation trench extending along the first direction and continuously communicating with the plurality of first trenches.

7. The method according to claim 6, wherein the forming a first spacer at least positioned in the isolation trench comprises:
  depositing a second dielectric material along the given first trench to form the first spacer at least filling up the isolation trench.

8. The method according to claim 7, wherein a top surface of the first spacer is flush with a bottom surface of the given first trench; and
  the top surface of the first spacer is positioned above the bottom surface of the given first trench.

9. The method according to claim 6, wherein the forming a capacitor above the first spacer comprises:
  removing the protective layer, the sacrificial layer and the support layer positioned above the first spacer, to form etch holes comprising the given first trench and the given second trench communicating with each other and a semiconductor pillar positioned between adjacent two of the etch holes, wherein the semiconductor pillar comprising a conductive pillar positioned in the capacitor region and an active pillar positioned in the active area;
  forming a conductive layer covering a side wall of the conductive pillar;
  forming a dielectric layer covering a surface of the conductive layer; and
  forming an upper electrode layer covering a surface of the dielectric layer.

10. The method according to claim 9, wherein the doping element is implanted into two opposite side surfaces of the conductive pillar along the second direction.

11. The method according to claim 9, wherein after forming a capacitor above the first spacer, the method further comprises:
  defining, in the active pillar, a channel region and a drain region and a source region distributed on two opposite sides of the channel region along a third direction, wherein the drain region is in contact with the conductive pillar, the third direction being a direction perpendicular to a top surface of the substrate; and
  forming a plurality of word lines spaced along the first direction, wherein each of the plurality of word lines extends along the second direction and continuously wraps the plurality of channel regions spaced along the second direction.

12. The method according to claim 11, wherein after forming a plurality of word lines spaced along the first direction, the method further comprises:
  forming a plurality of bit lines spaced along the second direction above the semiconductor layer, wherein each of the plurality of bit lines extends along the first direction and is continuously electrically connected to the plurality of source regions spaced along the first direction.

13. The method according to claim 3, wherein the forming the plurality of first trenches spaced along the first direction comprises:
  etching the semiconductor layer along the second direction to form the plurality of first trenches spaced along the first direction, wherein a depth of the given first trench is smaller than a depth of the given second trench.

14. A semiconductor structure for a DRAM, comprising:
  a substrate;
  a semiconductor layer positioned above the substrate;
  a first spacer positioned above the semiconductor layer; and
  a capacitor structure positioned above the spacer and comprising a plurality of capacitors;
  wherein each of the plurality of capacitors comprises:
    a lower electrode layer comprising a conductive pillar and a conductive layer covering a side wall of the conductive pillar, wherein a material of the conductive pillar is the same as a material of the semiconductor layer;
    a dielectric layer covering a surface of the conductive layer; and
    an upper electrode layer covering a surface of the dielectric layer.

15. The semiconductor structure according to claim 14, wherein the first spacer comprises:
  a first sub spacer positioned above the semiconductor layer;

a plurality of second sub spacers protruded from a top surface of the first sub spacer, wherein the conductive pillar extends between adjacent two of the plurality of second sub spacers.

16. The semiconductor structure according to claim 15, further comprising:
a protective layer positioned between each of the plurality of second sub spacers and the conductive pillar.

17. The semiconductor structure according to claim 14, further comprising:
a plurality of sacrificial layers positioned between the substrate and the capacitor structure, wherein the plurality of sacrificial layers are spaced along a second direction, and each of the plurality of sacrificial layers extends along a first direction, the first direction intersecting the second direction.

18. The semiconductor structure according to claim 17, wherein a bottom surface of each of the plurality of sacrificial layers is positioned below a bottom surface of the first spacer, and the plurality of sacrificial layers are embedded in the semiconductor layer.

19. The semiconductor structure according to claim 17, wherein a material of the plurality of sacrificial layers is a first dielectric material comprising a doping element, and a material of the conductive pillar is a silicon material comprising the doping element.

* * * * *